(12) United States Patent  
Asaki et al.

(10) Patent No.: US 8,227,796 B2
(45) Date of Patent: Jul. 24, 2012

(54) DISPLAY DEVICE

(75) Inventors: Reo Asaki, Tokyo (JP); Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 813 days.

(21) Appl. No.: 12/268,501

(22) Filed: Nov. 11, 2008

(65) Prior Publication Data

US 2009/0121239 A1 May 14, 2009

(30) Foreign Application Priority Data

Nov. 13, 2007 (JP) ................................. 2007-293814

(51) Int. Cl.
*H01L 29/08* (2006.01)
*H01L 35/24* (2006.01)
*H01L 51/00* (2006.01)

(52) U.S. Cl. ............... 257/40; 257/99; 257/79; 257/88; 257/E33.069; 257/E51.022; 257/E51.012; 257/E51.018; 257/E51.026; 438/28; 438/29; 438/34; 438/35; 438/99; 313/504; 313/506; 313/113; 359/302; 359/298; 359/299; 359/247; 359/248; 252/301.16

(58) Field of Classification Search ........... 257/E33.069, 257/E51.012, E51.022, E51.018, E51.026, 257/40, 79, 88, 98; 438/28, 29, 34, 35, 82, 438/99; 313/504, 506, 113; 359/302, 298, 359/299, 247, 248; 252/301.16
See application file for complete search history.

(56) References Cited

FOREIGN PATENT DOCUMENTS

| JP | 2006253015 A | * | 9/2006 |
| JP | 2007-066883 | | 3/2007 |
| JP | 2007-234581 | | 9/2007 |
| WO | WO2006035956 | | 4/2006 |

* cited by examiner

*Primary Examiner* — Meiya Li
(74) *Attorney, Agent, or Firm* — SNR Denton US LLP

(57) ABSTRACT

A display device includes light emitting elements corresponding to respective colors disposed on a substrate. Each of the light emitting elements corresponding to the respective colors has a cavity structure in which a light emission functioning layer including a light emitting layer is held between a reflecting electrode and a semitransmitting electrode. A cavity order of at least the light emitting element adapted to resonate a light, having the shortest wavelength, of the light emitting elements corresponding to the respective colors is 1, and a cavity order of each of other light emitting elements is 0. The light emission functioning layer except for the light emitting layer is common to the light emitting elements corresponding to the respective colors.

5 Claims, 8 Drawing Sheets

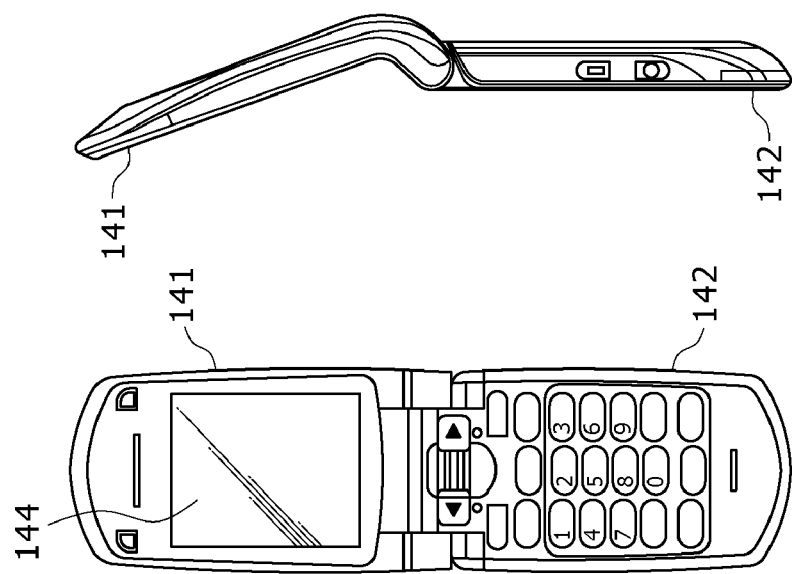
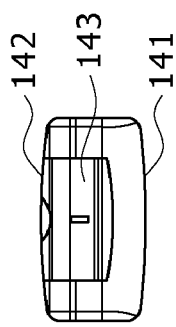
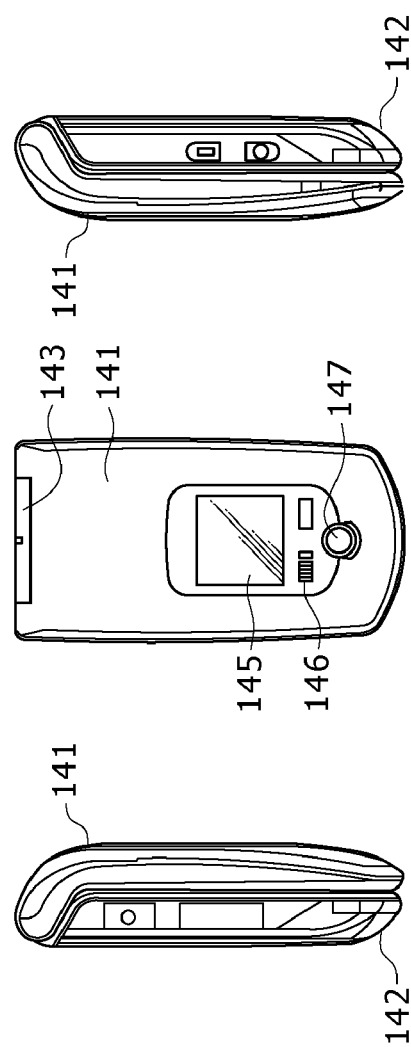
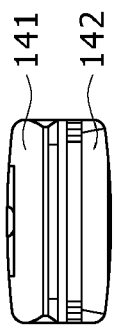
FIG.10A  FIG.10B  FIG.10C  FIG.10D  FIG.10E  FIG.10F  FIG.10G

DISPLAY DEVICE

CROSS REFERENCES TO RELATED APPLICATIONS

The present invention contains subject matter related to Japanese Patent Application JP 2007-293814 filed in the Japan Patent Office on Nov. 13, 2007, the entire contents of which being incorporated herein by reference.

BACKGROUND OF THE INVENTION

1. Field of the Invention

The present invention relates to a display device in which self-light emission type elements such as organic electroluminescence (EL) elements are disposed, and more particularly to a display device in which elements, for emitting lights having respective colors, each having a cavity structure are provided.

2. Description of Related Art

In recent years, an organic electroluminescence (EL) display device using organic EL elements has been put into practical use as a display device substituted for a liquid crystal display device. The organic EL display device has a wider view angle than that in the liquid crystal display device because it is of a self-light emission type. In addition, the organic EL display device is expected to have a sufficient response to a high-speed video signal for high definition.

Up to this day, for the organic EL element, by introducing a cavity structure, color purities of emission colors have been enhanced, and luminance efficiency has been improved, and so forth. In such a way, there has been made the attempt to control the lights emitted from light emitting layers, respectively. However, when the resonator structure is introduced into the organic EL element, light extraction efficiency in a front direction is enhanced for a displayed picture because a spectrum of a resonated light is high in peak and narrow in width. On the other hand, in this case, there is a problem that when the picture is viewed from an oblique direction, an emission wavelength is largely shifted, and emission intensity is reduced.

In order to cope with the above problem, a structure is proposed such that an optical distance of a resonation portion is set as a minimum value so as to fall within the condition range meeting the cavity structure, which results in that by holding a peak width while a peak intensity of a spectrum of an extracted light is increased based on a cavity effect, even when a view angle is shifted, a shift amount of wavelength is reduced, and a color purity is enhanced so as to fall within a wide view angle. This structure, for example, is described in PCT Patent Publication No. WO01/39554 (pamphlet) (hereinafter referred to as Patent Document 1) and Japanese Patent Laid-Open No. 2006-147598 (hereinafter referred to as Patent Document 2).

In addition thereto, an attempt is made such that a light emitting portion of an organic EL element having a resonator structure is formed in the form of a concave structure, and a light diffusing portion and a light deflecting portion are provided on a transparent substrate on a light-extracting side of the organic EL element, which results in that an emission direction of a light is diffused to average a directionality of the light, thereby increasing a view angle. This attempt, for example, is disclosed in Japanese Patent Laid-Open No. Hei 9-190883 (hereinafter referred to as Patent Document 3).

SUMMARY OF THE INVENTION

However, with the structure, described in Patent Document 1 and Patent Document 2, in which the optical distance of the cavity portion is set as the minimum value, a thickness of an organic layer in the organic EL element is reduced. The thinning of the organic layer causes a problem that pixel defects, such as a vanishing point, because an inter-electrode short-circuit generates.

In addition, with the structure described in Patent Document 3, it is necessary to newly form the concave structure, the light diffusing layer and the light deflecting layer, which leads to cost-up. In addition, there is a new problem that an outside light is also scattered by the concave structure, the light diffusing layer and the light deflecting layer formed on the transparent substrate, so that an outside light contrast deteriorates remarkably.

Here, in a color organic EL display device in which organic EL elements for emitting lights having colors of red (R), green (G) and blue (B), respectively, are disposed on a substrate, when there is a dispersion in view angle characteristics of the organic EL elements for emitting lights having colors of R, G and B, the view angle characteristics of white is generally deteriorated. In other words, even when the view angle characteristics of the organic EL element are improved every color, it may be impossible to enhance the view angle characteristics of white as long as there is the dispersion in the view angle characteristics of the colors.

In the light of the foregoing, it is therefore desirable to provide a display device which is capable of reducing pixel defects of organic EL elements, and enhancing view angle characteristics of white which is easily visualized in terms of a visual feature of a human being without increasing a cost in a structure in which the organic EL elements, for emitting lights having the respective colors, each having a resonator structure are disposed.

In order to attain the desire described above, according to an embodiment of the present invention, there is provided a display device having light emitting elements corresponding to respective colors disposed on a substrate. Each of the light emitting elements corresponding to the respective colors has a cavity structure in which a light emission functioning layer including a light emitting layer is held between a reflecting electrode and a semitransmitting electrode. A cavity order of at least the light emitting element adapted to resonate a light, having the shortest wavelength, of the light emitting elements corresponding to the respective colors is 1, and a cavity order of each of other light emitting elements is 0. The light emission functioning layer except for the light emitting layer is common to the light emitting elements corresponding to the respective colors.

In the display device having the structure described above, the cavity order of at least the light emitting element adapted to resonate the light, having the shortest wavelength (that is, the light emitting element having the shortest optical distance L in the cavity portion (the light emission functioning layer) when the cavity orders are identical to one another) of the light emitting elements corresponding to the respective colors and each having the cavity structure is 1, and the cavity order of each of other light emitting elements is 0. For this reason, the light emission functioning layer in at least the light emitting element having the cavity portion having the thinnest film thickness can be thickened to suppress the generation of the vanishing point while the deterioration of the view angle characteristics of the lights extracted from the light emitting elements, respectively, is suppressed. In addition thereto, the layers having the same structure and constituting the light emission functioning layer except for the light emitting layer in the light emitting elements are made the common layer. As a result, it is possible to approximate tendencies to show the dispersion in the total film thicknesses of the light emission functioning layers. Therefore, it is possible to enhance the view angle characteristics of white obtained by synthesizing the emitted lights corresponding to the respective colors.

As set forth hereinabove, according to the display device of an embodiment of the present invention, it is possible to reduce the pixel defects of the organic EL elements, and to enhance the view angle characteristics of white which is easily visualized in terms of the visual feature of a human being without increasing the cost in the color display device in which the organic EL elements corresponding to the respective colors and each having the resonator structure are disposed.

BRIEF DESCRIPTION OF THE DRAWINGS

FIGS. 10A to 10G are respectively a front view of mobile terminal equipment or, for example, a mobile phone, in an open state, to which an embodiment of the present invention is applied, a side elevational view thereof, a front view thereof in a close state, a left side elevational view thereof, a right side elevational view thereof, a top plan view thereof, and a bottom view thereof.

DETAILED DESCRIPTION OF THE PREFERRED EMBODIMENTS

Embodiments of the present invention will be described in detail hereinafter with reference to the accompanying drawings. In the following description, there are described embodiments in each of which the present invention is applied to a display device having a structure with which organic electroluminescence (EL) elements for emitting lights having colors of red (R), green (G) and blue (B), respectively, are disposed on a substrate for the purpose of performing full-color display.

<First Embodiment>

Figure 1:
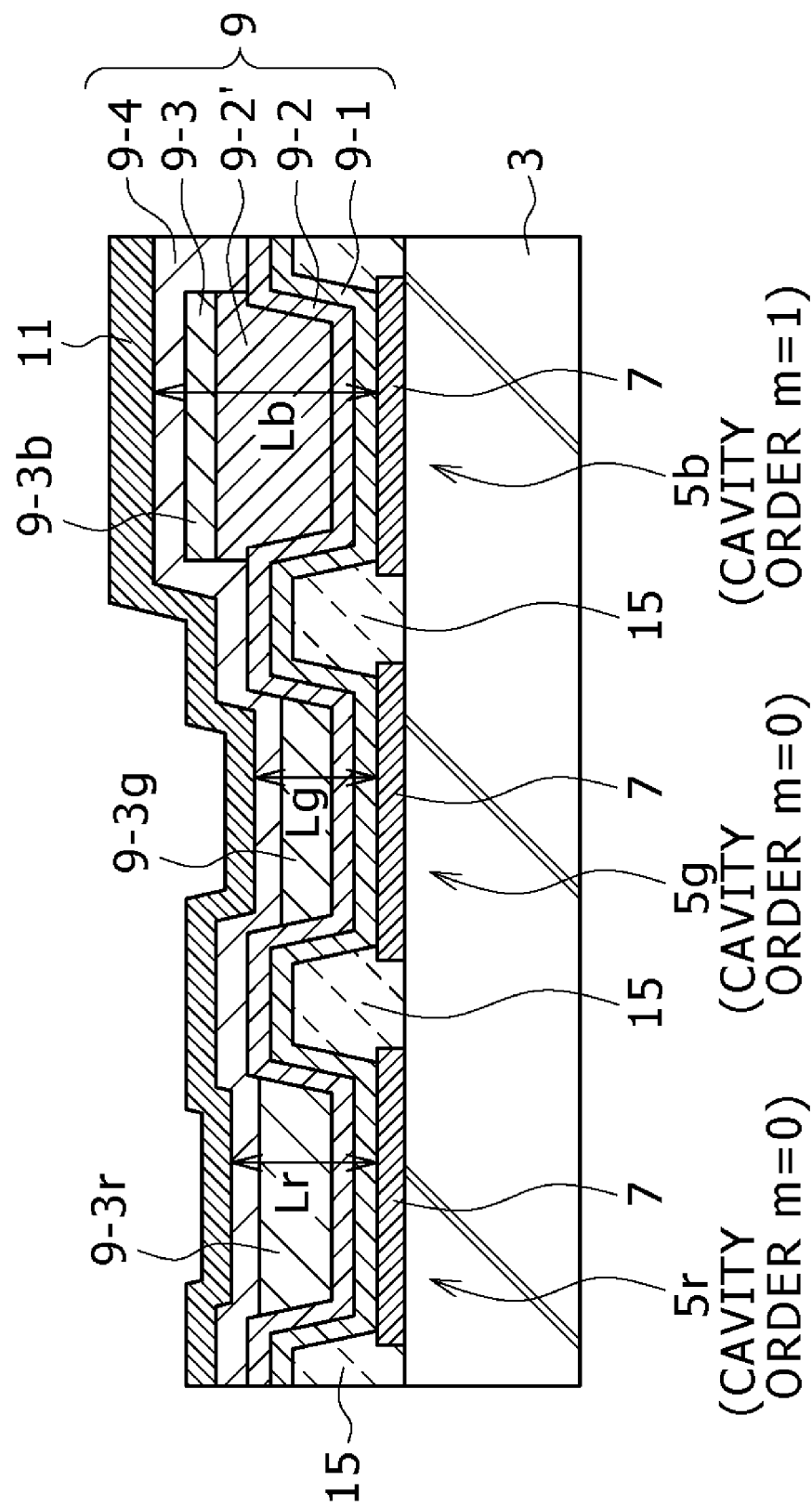
FIG. 1 is a cross sectional view of a main portion explaining a display device according to a first embodiment of the present invention.

FIG. 1 is a cross sectional view of a main portion explaining a display device according to a first embodiment of the present invention. In a display device 1*a* shown in the figure, organic EL elements 5*r*, 5*g* and 5*b* for emitting lights having colors of red (R), green (G) and blue (B), respectively, that is, the red light emitting element 5*r*, the green light emitting element 5*g* and the blue light emitting element 5*b* are disposed in a matrix on a substrate 3. Also, the display device 1*a* is structured as an upper surface emission type display device in which the lights emitted from the light emitting elements 5*r*, 5*g* and 5*b*, respectively, are extracted from a side opposite to the substrate 3.

The substrate 3 is a so-called thin film transistor (TFT) substrate obtained by disposing and forming TFT transistors (not shown) on a surface layer of a glass substrate, a silicon substrate, a plastic substrate or the like. Also, a surface of the substrate 3 is covered with a planarization insulating film.

Also, each of the light emitting elements 5*r*, 5*g* and 5*b* is structured in a way that an anode 7, a light emission functioning layer 9, an electron injecting layer, and a cathode 11 are laminated in this order on the substrate 3. Also, each of the light emitting elements 5*r*, 5*g* and 5*b* is structured in the form of a minute resonator structure in which the anode 7 is formed as a mirror composed of a reflecting electrode, the cathode 11 is formed as a half mirror composed of a semitransmissive-semireflecting electrode, and the light having a specific wavelength emitted from the light emitting element 5*r*, 5*g* or 5*b* is resonated to be extracted from the cathode (half mirror) 11 side.

That is to say, in the red light emitting element 5*r*, an optical distance Lr of a cavity portion is adjusted so that the lights each having a color of red falling within a red waveform region are resonated in the cavity portion between the corresponding one of the anodes (mirrors) 7 and the cathode (half mirror) 11, thereby obtaining extraction efficiency at a local maximum. In addition, in the green light emitting element 5*g*, an optical distance Lg of a cavity portion is adjusted so that the lights each having a color of green falling within a green waveform region are resonated in the cavity portion between the corresponding one of the anodes (mirrors) 7 and the cathode (half mirror) 11, thereby obtaining extraction efficiency at a local maximum. Moreover, in the blue light emitting element 5*b*, an optical distance Lb of a cavity portion is adjusted so that the lights each having a color of blue falling within a blue waveform region are resonated in the cavity portion between the corresponding one of the anodes (mirrors) 7 and the cathode (half mirror) 11, thereby obtaining extraction efficiency at a local maximum. As a result, the lights having emission colors of R, G and B are extracted from the light emitting elements 5*r*, 5*g* and 5*b* at sufficient intensities, respectively.

Here, the optical distance L (Lr, Lg or Lb) of the light emitting element 5*r*, 5*g* or 5*b* is set within the range meeting Expression (1):

$$2L/\lambda + \Phi/2\pi = m \qquad (1)$$

where $\Phi$ (radian) is a sum of phase shifts $\Phi 1$ and $\Phi 2$ of reflected lights generated on both ends of the cavity portion, $\lambda$ is a peak wavelength of a spectrum desired to be extracted, and m is a cavity order as an integral number allowing the optical distance L to be positive.

However, in Expression (1), L and $\lambda$ may have a common unit, and thus (nm), for example, is used as the common unit.

Also, in particular, the feature of the display device 1*a* of the first embodiment is that, of the light emitting elements 5*r*, 5*g* and 5*b*, the blue light emitting element 5*b* which resonates the shortest wavelength has the cavity order m of 1, and the red light emitting element 5*r* and the green light emitting element 5*g* have each the cavity order m of 0.

The optical distances Lr, Lg and Lb in the light emitting elements 5r, 5g and 5b in which the cavity orders are set as 0, 0 and 1, respectively, are adjusted based on film thicknesses of the light emission functioning layer 9, respectively, as will be described later.

Next, the layers constituting the light emitting elements 5r, 5g and 5b having the minute resonator structures as described above will be described in order from the substrate 3 side.

Firstly, each of the anodes 7 is structured in the form of the mirror composed of the reflecting electrode. A thickness of each of the anodes 7 in a lamination direction (hereinafter referred to as "a film thickness") for example, has a value between 100 to 1000 nm. Thus, forming each of the anodes 7 so as to have a high reflectivity as much as possible is preferable in terms of enhancement of luminance efficiency. A simple substance of a metallic element such as chromium (Cr), gold (Au), platinum (Pt), nickel (Ni), copper (Cu), tungsten (W) or silver (Ag), or an alloy thereof, for example, is given as a material of which such an anode 7 is made.

For example, in order to allow the active matrix drive by the display device 1a, the anodes 7 are formed in a pattern so as to correspond to the pixels, respectively. Also, the anodes 7 are electrically connected to the TFTs through the contact holes (not shown), respectively, which are formed in an interlayer insulating film covering the surface of the substrate 3.

Each of the anodes (mirrors) 7 formed in a pattern so as to correspond to the pixels, respectively, is covered in a periphery thereof with an insulating film 15 with only a central portion thereof being exposed. This insulating film 15, for example, is made of either an organic insulating material such as polyimide or a photo resist, or an inorganic insulating material such as a silicon oxide.

Also, the light emission functioning layer 9 provided on each of the anodes (mirrors) 7, for example, is composed of a hole injecting layer 9-1, a hole transporting layer 9-2, a light emitting layer 9-3, and an electron transporting layer 9-4 which are laminated in this order on the corresponding one of the anodes 7. In addition, a film thickness adjusting layer 9-2' for adjusting the cavity order m is formed in a pattern on a part of the light emitting elements 5r, 5g and 5b (the blue light emitting element 5b in this embodiment). This film thickness adjusting layer 9-2' may be made of the same material as that of which any of the layers constituting the light emission functioning layer 9 is made. In this embodiment, the film thickness adjusting layer 9-2', for example, is formed, as a second hole transporting layer made of the same material as that of which the hole transporting layer 9-2 is made, between the hole transporting layer 9-2 and the blue light emitting layer 9-3b.

The light emitting layers 9-3 for emitting the lights having the colors of R, G and B, respectively, of the layers constituting the light emission functioning layer 9 are formed in a pattern so as to correspond to the light emitting elements 5r, 5g and 5b, respectively. In addition, the film thickness adjusting layer 9-2' is formed in a pattern only in the blue light emitting element 5b. On the other hand, other layers, i.e., the hole injecting layer 9-1, the hole transporting layer 9-2 and the electron transporting layer 9-4 other than the light emitting layer 9-3 and the film thickness adjusting layer 9-2' are common in structure to the light emitting elements 5r, 5g and 5b, and thus are provided in the form of a common layer. This is the feature of the display device of this embodiment.

Also, in the first embodiment, the optical distances Lr, Lg and Lb in the light emitting elements 5r, 5g and 5b in which the cavity orders m are set in the manner described above, respectively, are adjusted based on the film thicknesses of the light emitting layers 9-3 for emitting the red light, the green light and the blue light in the light emitting elements 5r, 5g and 5b, respectively, together with the film thickness of the film thickness adjusting layer 9-2' in the blue light emitting element 5b.

Hereinafter, the layers constituting the light emission functioning layer 9 will be described from the anode (mirror) 7 side.

Firstly, the hole injecting layer 9-1 is a buffer layer for enhancing an efficiency of injecting the holes into the light emission functioning layer 19, and preventing occurrence of a leakage current. The hole injecting layer 9-1 is provided as being common to the pixels so as to cover the anodes 7 and the insulating film 15. Such a hole injecting layer 9-1 is made of a general hole injecting material. As an example, the hole injecting layer 9-1 is made of either 4,4',4"-tris(3-methylphenylphenylamino)triphenylamine (m-MTDATA), or 4,4',4"-tris(2-naphtylphenylamino)triphenylamine (2-TNATA). A film thickness of such a hole injecting layer 9-1, for example, is set within the range of 5 to 300 nm.

Next, the hole transporting layer 9-2 is provided for the purpose of enhancing an efficiency of transporting the holes to the light emitting layer 9-3. The hole transporting layer 9-2 is provided as being common to the pixels on the hole injecting layer 9-1. Such a hole transporting layer 9-2 is made of a general hole transporting material. For example, the hole transporting layer 9-2 is made of bis[(N-naphthyl)-N-phenyl] benzidine ($\alpha$-NPD). A film thickness of such a hole transporting layer 9-2, for example, is set within the range of 5 to 300 nm.

It is noted that the hole injecting layer 9-1 and hole transporting layer 9-2 described above may have lamination structures, respectively, each of which is composed of a plurality of layers.

In addition, the film thickness adjusting layer 9-2' provided only in the blue light emitting element 5b may be made of the same material as that of which the hole transporting layer 9-2 is made. A film thickness of the film thickness adjusting layer 9-2' is set so that the blue light emitting element 5b has the cavity order m of 1. It is noted that the film thickness adjusting layer 9-2' made of such a hole transporting material may also be provided between the hole transporting layer 9-2 and the hole injecting layer 9-1.

The light emitting layer 9-3 is a layer in which the holes injected from the anode 7 side and the electrons injected from the cathode 11 side are re-combined with each other to emit the lights. In this embodiment, the red light emitting layer 9-3r for emitting red lights is provided in the red light emitting element 5r. The green light emitting layer 9-3g for emitting green lights is provided in the green light emitting element 5g. Also, the blue light emitting layer 9-3b for emitting blue lights is provided in the blue light emitting element 5b.

The light emitting layers 9-3r, 9-3g and 9-3b are formed in a pattern so as to correspond to the pixels, respectively, in a state of perfectly infilling opening windows formed in the insulating film 15. Here, in the light emitting elements 5r, 5g and 5b, the optical distances Lr, Lg and Lb thereof are adjusted so that the red lights each having the specific wavelength are resonated between the corresponding one of the anodes (mirrors) 7 and the cathode (half mirror) 11, the green lights each having the specific wavelength are resonated between the corresponding one of the anodes (mirrors) 7 and the cathode (half mirror) 11, and the blue lights each having the specific wavelength are resonated between the corresponding one of the anodes (mirrors) 7 and the cathode (half mirror) 11. Thus, in this embodiment, the optical distances Lr, Lg and Lb are adjusted based on the differences in film thickness among the light emitting layers 9-3r, 9-3g and 9-3b together with the film thickness of the film thickness adjusting layer 9-2'.

The red light emitting layer 9-3r of the red light emitting element 5r, for example, is made of a material obtained by mixing 8-quinolinol aluminum complex (Alq3) with 40 Vol % 2,6-bis[4-[N-(4-methoxyphenyl)-N-phenyl]aminostyryl] naphthalene-1,5-dicarbonytolyl (BSN-BCN). Also, a film thickness of the red light emitting layer 9-3r is set within the range of 10 to 100 nm.

The green light emitting layer 9-3g of the green light emitting element 5g, for example, is formed by mixing Alq3 with 3 Vol % coumarin 6. Also, a film thickness of the green light emitting layer 9-3g is set within the range of 10 to 100 nm.

The blue light emitting layer 9-3b of the blue light emitting element 5b, for example, is made of spiro6Φ. Also, a film thickness of the blue light emitting layer 9-3b is set within the range of 10 to 100 nm.

Also, the electron transporting layer 9-4 formed over the red light emitting layer 9-3r, the green light emitting layer 9-3g, and the blue light emitting layer 9-3b having the respective structures described above is provided for the purpose of enhancing the efficiencies of transporting the electrons to the light emitting layers 9-3r, 9-3g and 9-3b, respectively. Also, the electron transporting layer 9-4 is provided as being common to the pixels. Such an electron transporting layer 9-4 is made of a general electron transporting material. As an example, the electron transporting layer 9-4 is made of 8-hydroxyquinoline aluminum (Alq3), and a film thickness thereof is set within the range of 5 to 300 nm.

The light emission functioning layer 9 is composed of the hole injecting layer 9-1, the hole transporting layer 9-2, the film thickness adjusting layer 9-2', the light emitting layer 9-3r, 9-3g or 9-3b, and the electron transporting layer 9-4.

It is noted that in the light emission functioning layer 9, the layers other than the light emitting layer 9-3 may be provided when necessary. Moreover, an electron injecting layer may also be provided on the electron transporting layer 9-4 as may be necessary. The electron injecting layer, for example, is made of LiF, $Li_2O$ or the like.

Also, the cathode 11 provided on the light emission functioning layer 9 is structured in the form of a half mirror composed of the semitransmissive-semireflecting electrode. A film thickness of the cathode 11 is set within the range of 5 to 50 nm. A simple substance of a metallic element such as aluminum (Al), magnesium (Mg), calcium (Ca) or sodium (Na) or an alloy thereof is given as the material of which such a cathode 11 is made. Of them, an alloy (MgAg alloy) of magnesium (Mg) and silver (Ag), or an alloy (AlLi alloy) of aluminum (Al) and lithium (Li) is preferably given as the material of which such a cathode 11 is made.

The light emitting elements 5r, 5g and 5b including the light emission functioning layer 9 having the light emitting layer 9-3 held between the corresponding one of the anodes (mirrors) 7 and the cathode (half mirror) 11 are covered with a protective film (not shown) made of silicon nitride (SiNx). Also, a sealing substrate made of a glass or the like is stuck to the entire surface of the protective film through an adhesive layer, thereby sealing the light emitting elements 5r, 5g and 5b.

With the display device 1a structured in the manner described above, the red, green and blue lights having the respective wavelengths emitted from the light emitting layers 9-3r, 9-3g and 9-3b of the light emitting elements 5r, 5g and 5b are resonated between the corresponding ones of the anodes (mirrors) 7 and the cathode (half mirror) 11 to be extracted from the cathode (half mirror) 11. The introduction of such resonator structures results in that half bandwidths of the spectra of the red, green and blue lights extracted from the light emitting elements 5r, 5g and 5b are reduced, thereby making it possible to increase the respective peak intensities. That is to say, the color purities can be enhanced to increase the luminance efficiencies. In addition, the outside lights made incident from the cathode (half mirror) 11 side can be attenuated through a multiple interference. The reflectivities of the outside lights in the respective organic EL elements can be made very small by the combination with a color filter (not shown).

In particular, in the display device 1a of the first embodiment, the cavity orders m of the cavity structures of the red light emitting element 5r, the green light emitting element 5g, and the blue light emitting element 5b are set to 0, 0 and 1, respectively. As a result, the total film thickness (corresponding to the optical distance Lb) of the light emission functioning layer 9 in the blue light emitting element 5b can be increased to the same degree as that in each of the cases of the red light emitting element 5r and the green light emitting element 5g while there are maintained the view angle characteristics of the red light emitted from the red light emitting element 5r, and the green light emitted from the green light emitting element 5g. Therefore, it becomes possible to suppress the occurrence of the vanishing points in all the light emitting elements 5r, 5g and 5b.

Moreover, the layers constituting the light emission functioning layer 9, other than the red light emitting layer 9-3r, the green light emitting layer 9-3g and the blue light emitting layer 9-3b, and the film thickness adjusting layer 9-2' are made the common layer in the light emitting elements 5r, 5g and 5b. As a result, it is possible to approximate the tendencies to show the dispersion in the total film thicknesses of the light emission functioning layers 9 in the light emitting elements 5r, 5g and 5b. Therefore, it is possible to enhance the view angle characteristics of white which is obtained by synthesizing the emitted lights corresponding to the respective colors, and which is especially, easily visualized in terms of a visual feature of a human being.

<Second Embodiment>

Figure 2:
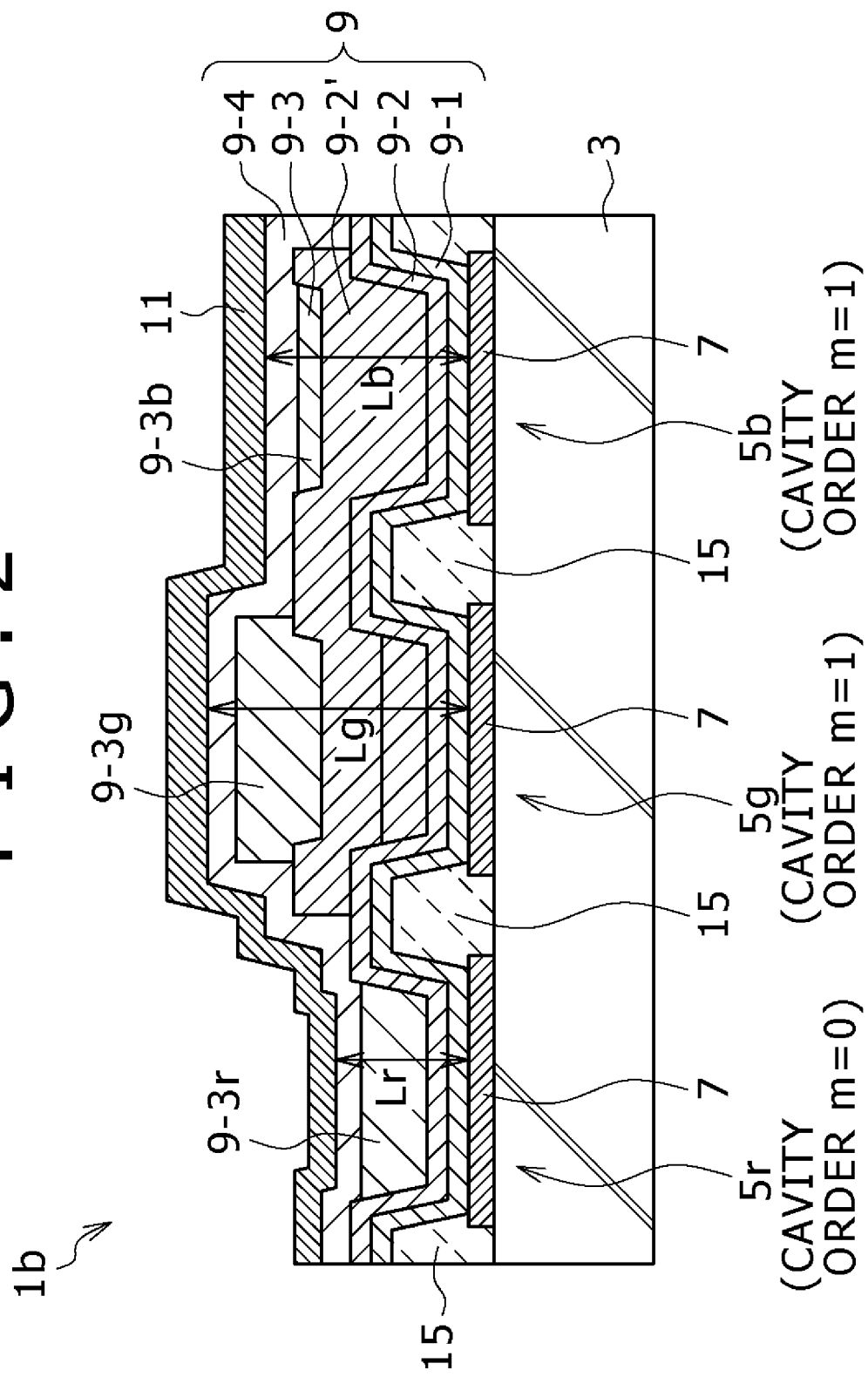
FIG. 2 is a cross sectional view of a main portion explaining a display device according to a second embodiment of the present invention.

FIG. 2 is a cross sectional view of a main portion explaining a display device according to a second embodiment of the present invention. A display device 1b of the second embodiment shown in FIG. 2 is different from the display device 1a of the first embodiment in that the cavity orders m of the blue light emitting element 5b and the green light emitting element 5g are each set to 1, and the cavity order of the red light emitting element 5r is set to 0, and moreover the layer structure for realizing this is obtained. Other structures of the display device 1b of the second embodiment are the same as those of the display device 1a of the first embodiment.

Optical distances Lr, Lg and Lb in the light emitting elements 5r, 5g and 5b in which the cavity orders m are set to 0, 1 and 1, respectively, as described above are adjusted based on the film thicknesses of the light emitting layers 9-3r, 9-3g and 9-3b corresponding to the respective colors together with the film thickness of the film thickness adjusting layer 9-2' similarly to the case of the first embodiment. In addition, in the second embodiment, in order to realize such a combination of the cavity orders m, for example, the film thickness adjusting layer 9-2' is formed in a pattern as a common layer to the green light emitting layer 5g and the blue light emitting element 5b.

Even in the display device 1b having such a structure, the introduction of the resonator structures results in that it is possible to enhance the color purities of the red, green and blue lights extracted from the light emitting elements 5r, 5g and 5b, thereby increasing the luminance efficiencies, respectively.

In particular, in the display device 1b of the second embodiment, the cavity orders m of the cavity structures of the light emitting elements 5r, 5g and 5b are set to 0, 1 and 1, respectively. As a result, the total film thickness (corresponding to the optical distance Lb, Lg) of each of the light emission functioning layers 9 in the blue light emitting element 5b and the green light emitting element 5g can be increased to the same degree or more as that in the case of the total film thickness of the red light emitting element 5r while there is maintained the view angle characteristics of the red light extracted from the red light emitting element 5r. Therefore, it becomes possible to suppress the occurrence of the vanishing points in all the light emitting elements 5r, 5g and 5b.

Moreover, the layers constituting the light emission functioning layer 9, other than the red light emitting layer 9-3r, the green light emitting layer 9-3g and the blue light emitting layer 9-3b, and the film thickness adjusting layer 9-2' are made the common layer in the light emitting elements 5r, 5g and 5b. As a result, it is possible to enhance the view angle characteristics of white which is obtained by synthesizing the emitted lights corresponding to the respective colors, and which is especially, easily visualized in terms of the visual feature of a human being similarly to the case of the first embodiment.

<Third Embodiment>

Figure 3:
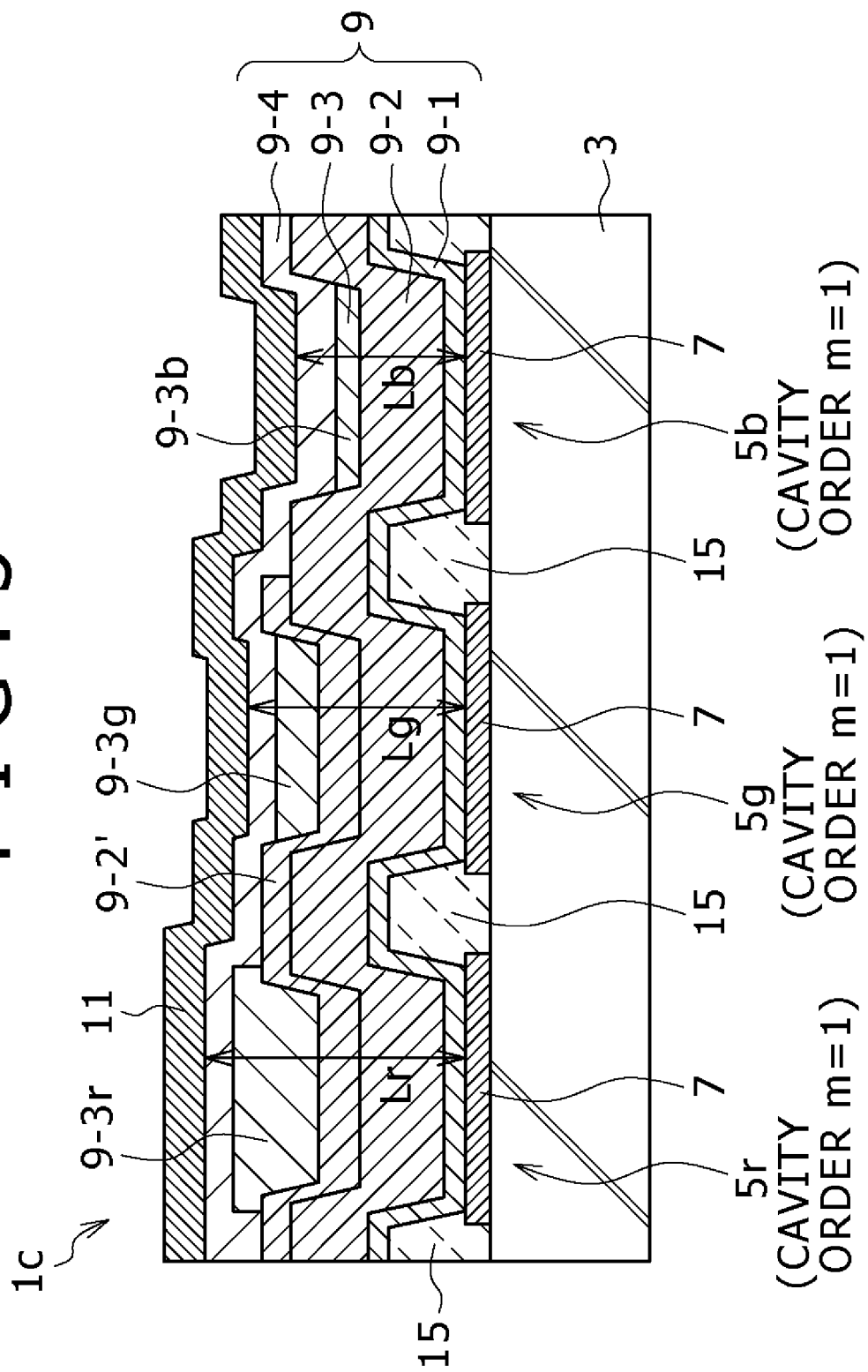
FIG. 3 is a cross sectional view of a main portion explaining a display device according to a third embodiment of the present invention.

FIG. 3 is a cross sectional view of a main portion explaining a display device according to a third embodiment of the present invention. A display device 1c of the third embodiment shown in FIG. 3 is different from the display device 1a of the first embodiment in that the cavity orders m of the light emitting elements 5r, 5g and 5b, corresponding to the respective colors, including the blue light emitting element 5b are each set to 1, and moreover the layer structure for realizing this is obtained. Other structures of the display device 1c of the third embodiment are the same as those of the display device 1a of the first embodiment.

Optical distances Lr, Lg and Lb in the light emitting elements 5r, 5g and 5b in which the cavity orders m are set to 1, 1 and 1, respectively, as described above are adjusted based on film thicknesses of light emitting layers 9-3r, 9-3g and 9-3b corresponding to the respective colors. In addition, in the third embodiment, in order to realize such a combination of the cavity orders m, for example, a film thickness adjusting layer 9-2' is formed in a pattern as a common layer to the red light emitting layer 5r and the green light emitting element 5g.

Even in the display device 1c having such a structure, the introduction of the resonator structures results in that it is possible to enhance the color purities of the red, green and blue lights extracted from the light emitting elements 5r, 5g and 5b, thereby increasing the luminance efficiencies, respectively.

In particular, in the display device 1c of the third embodiment, the cavity orders m of the cavity structures of the light emitting elements 5r, 5g and 5b are set to 1, 1 and 1, respectively. As a result, the total film thickness (corresponding to the optical distance) of the light emission functioning layer 9 can be increased while the reduction of the view angle characteristics of the red, green and blue lights extracted from the light emitting elements 5r, 5g and 5b, respectively, is kept to the minimum. Therefore, it becomes possible to more reliably suppress the occurrence of the vanishing points in all the light emitting elements 5r, 5g and 5b.

Moreover, the layers constituting the light emission functioning layer 9, other than the red light emitting layer 9-3r, the green light emitting layer 9-3g and the blue light emitting layer 9-3b, and the film thickness adjusting layer 9-2' are made the common layer in the light emitting element 5r, 5g and 5b. As a result, it is possible to enhance the view angle characteristics of white which is obtained by synthesizing the emitted lights corresponding to the respective colors, and which is especially, easily visualized in terms of the visual feature of a human being similarly to the case of the first embodiment.

It is noted that in each of the first to third embodiments described above, the description has been given with respect to the structure in which the film thickness adjusting layer 9-2' made of the hole transporting material is provided in a part of the light emitting elements. However, the film thickness adjusting layer is by no means limited to one made of the hole transporting material. Thus, the film thickness adjusting layer may be formed in any of the layers constituting the light emission functioning layer 9. In this case, the film thickness adjusting layer has to be disposed adjacent to the same material layer as that previously used as the film thickness adjusting layer. In addition, when the film thickness of the light emission functioning layer 9 becoming the cavity portion can be adjusted only based on the light emitting layers 9-3r, 9-3g and 9-3b, it is unnecessary to provide the film thickness adjusting layer.

In addition, in each of the first to third embodiments, the description has been given with respect to the structure in which each of the anodes 7 is used as the reflecting electrode (mirror), and the cathode 11 is used as the semitransmissive-semireflecting electrode (half mirror). However, the present invention is generally applied to the light emitting element having the structure in which the light emission functioning layer becoming the cavity portion is held between the reflecting electrode (mirror) and the semitransmissive-semireflecting electrode (half mirror). For this reason, for example, a structure may also be adopted such that each of the anodes 7 is used as the semitransmissive-semireflecting electrode (half mirror), and the cathode 11 is used as the reflecting electrode (mirror) as long as the lamination order of the layers constituting the light emission functioning layer between each of the anodes and the cathode is the same as that of each of the first to third embodiments.

<Circuit Configuration of Display Device>

Figure 4:
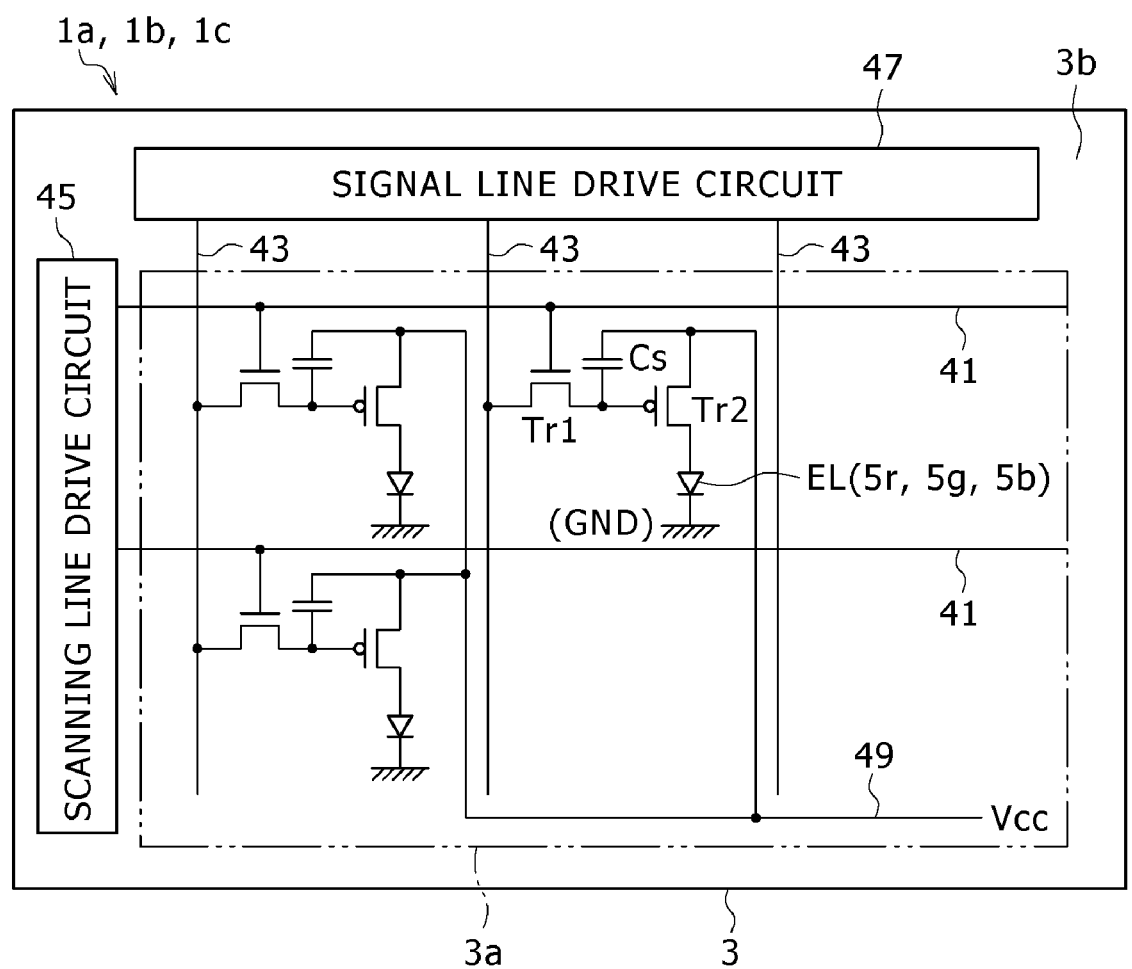
FIG. 4 is a circuit diagram, partly in block, showing an example of a circuit configuration of the display device of the first, second or third embodiment of the present invention.

FIG. 4 is a circuit diagram, partly in block, showing an example of a circuit configuration of the display device of the first, second or third embodiment of the present invention. As shown in the figure, a display region 3a and a peripheral region 3b thereof are provided in the substrate 3 constituting the display device 1a, 1b or 1c. A plurality of scanning lines 41 and a plurality of signal lines 43 are wired horizontally and vertically, respectively. Also, pixels are provided so as to correspond to intersection portions between the plurality of scanning lines 41 and the plurality of signal lines 43, respectively, thereby structuring a pixel array portion. In addition, a scanning line drive circuit 45 and a signal line drive circuit 47 are disposed in the peripheral region 3b. In this case, the scanning line drive circuit 45 scans and drives the scanning lines 41, and the signal line drive circuit 47 supplies a video signal (that is, an input signal) corresponding to luminance information to the signal lines 43.

A pixel circuit provided in each of the intersection portions between the scanning lines 41 and the signal lines 43, for example, is composed of a thin film transistor Tr1 for switching, a thin film transistor Tr2 for driving, a hold capacitor Cs, and an organic electroluminescence (EL) element EL. In this case, the light emitting element 5r, 5g or 5b described above is used as the organic EL element EL.

In the display device 1a, 1b or 1c having such a circuit configuration, the video signal written from the corresponding one of the signal lines 43 to the pixel is held in the hold capacitor Cs through the thin film transistor Tr1 for switching in accordance with the driving operation by the scanning line drive circuit 45. A current corresponding to an amount of video signal held in the hold capacitor Cs is supplied from the thin film transistor Tr2 for driving to the organic EL element EL. Also, the organic EL element EL emits a light with a luminance corresponding to the current value. It is noted that the thin film transistor Tr2 for driving, and the hold capacitor Cs are connected to a common power source supply line (Vcc) 49.

It is noted that the configuration of the pixel circuit as described above is merely an example, and thus the pixel circuit may be configured by providing a capacitor within the pixel circuit when necessary, and moreover by providing a plurality of transistors. In addition, a necessary drive circuit is added to the peripheral region 1b in correspondence to change of the pixel circuit.

Figure 5:
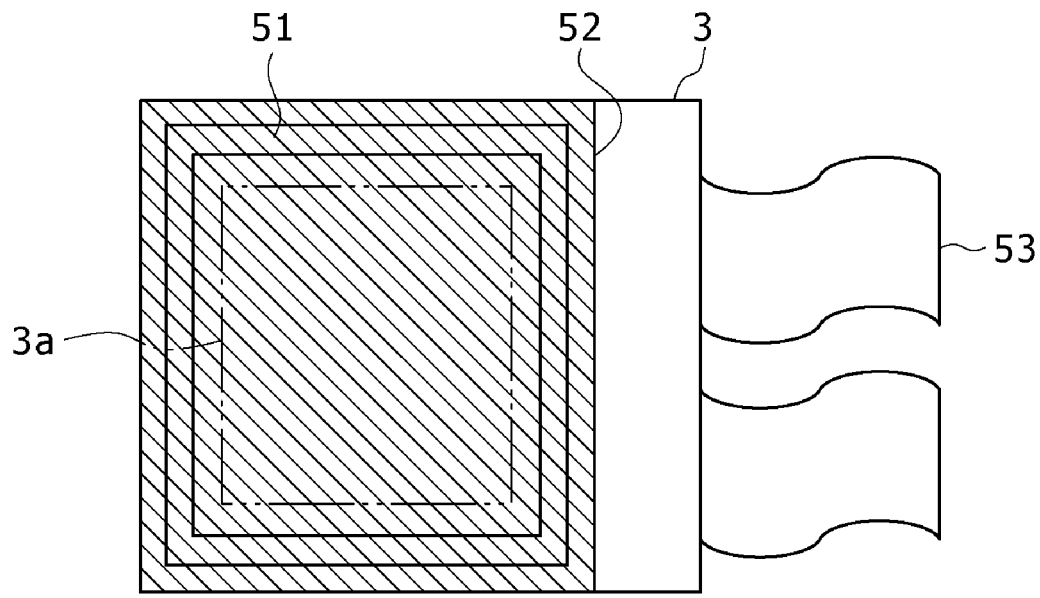
FIG. 5 is a structural view showing a module shaped display device, having a sealing structure to which an embodiment of the present invention is applied.

It is noted that the display device according to an embodiment of the present invention includes module shaped one having a sealed structure as shown in FIG. 5. For example, a display module which includes a sealing portion 51 provided so as to surround a display region 3a as a pixel array portion, and which is formed by being stuck to a counter portion (a sealing substrate 52) made of a transparent glass or the like by using the sealing portion 51 as an adhesive agent. A color filter, a protective film, a light shielding film, and the like may be formed on this transparent sealing substrate 52. It is noted that the substrate 3 as the display module having the display region 3a formed therein may be provided with a flexible printed board 53 through which a signal or the like is inputted/outputted to/from the display region (pixel array portion) 3a from/to the outside.

<Examples of Application>

The display devices, described above, according to an embodiment of the present invention can applied to display devices, of electronic apparatuses in all the fields, in each of which a video signal inputted to the electronic apparatus, or a video signal generated in the electronic apparatus is displayed in the form of an image or a video image. These electronic apparatuses are typified by various electronic apparatuses, shown in FIG. 6 to 10G, such as a digital camera, a notebook-size personal computer, mobile terminal equipment such as a mobile phone, and a video camera. Hereinafter, examples of electronic apparatuses to each of which an embodiment of the present invention is applied will be described.

Figure 6:
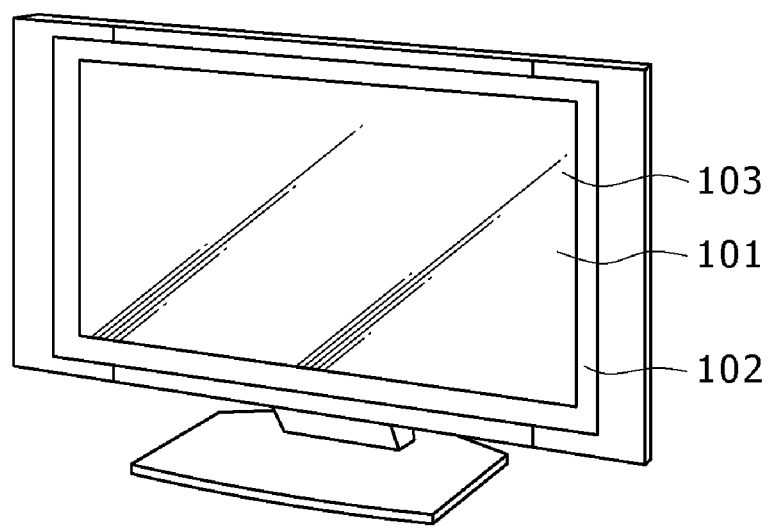
FIG. 6 is a perspective view of a television set to which an embodiment of the present invention is applied.

FIG. 6 is a perspective view showing a television set to which an embodiment of the present invention is applied. The television set according to this example of application includes an image display screen portion 101 composed of a front panel 102, a filter glass 103, and the like. Also, the television set is manufactured by using the display device according to an embodiment of the present invention as the image display screen portion 101.

Figure 7A:
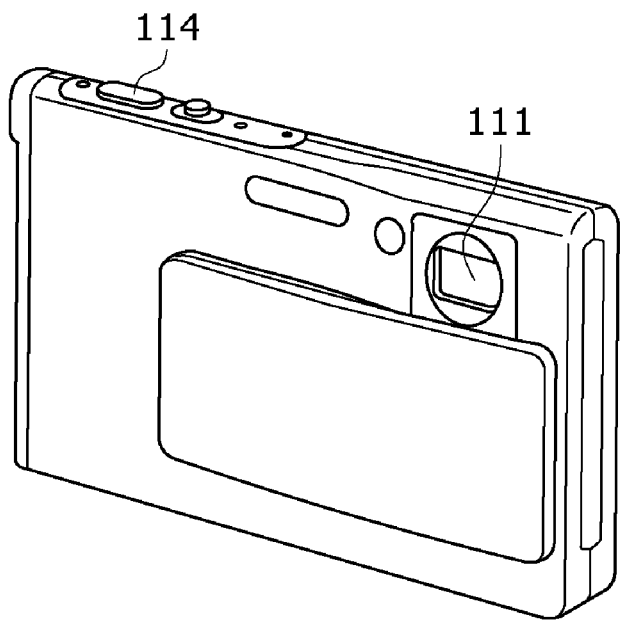
FIGS. 7A and 7B are respectively a perspective view of a digital camera, when viewed from a front side, to which an embodiment of the present invention is applied, and a perspective view of the digital camera, when viewed from a back side, to which an embodiment of the present invention is applied.
Figure 7B:
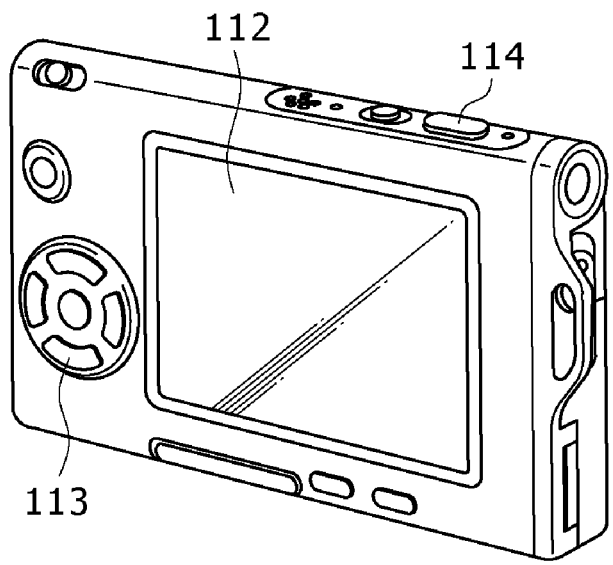

FIGS. 7A and 7B are respectively perspective views showing a digital camera to which an embodiment of the present invention is applied. FIG. 7A is a perspective view when the digital camera is viewed from a front side, and FIG. 7B is a perspective view when the digital camera is viewed from a back side. The digital camera according to this example of application includes a light emitting portion 111 for flash, a display portion 112, a menu switch 113, a shutter button 114, and the like. The digital camera is manufactured by using the display device according to an embodiment of the present invention as the display portion 112.

Figure 8:
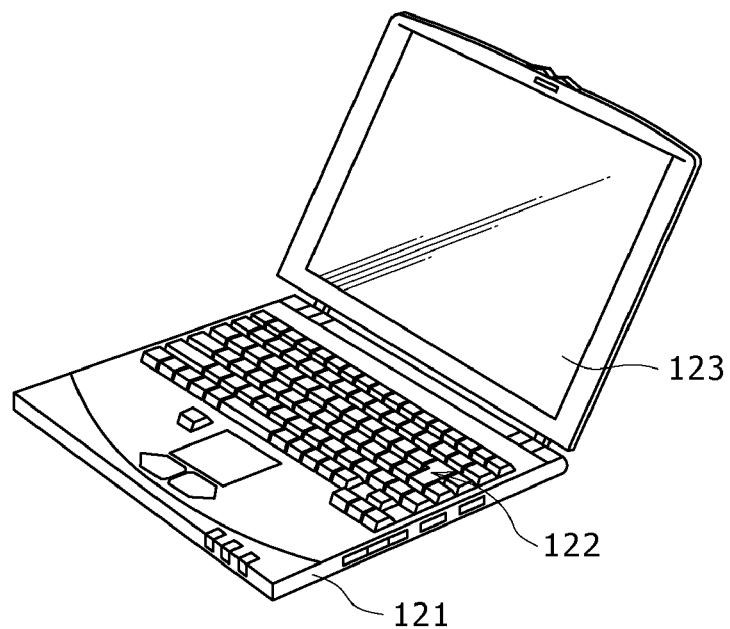
FIG. 8 is a perspective view showing a notebook-size personal computer to which an embodiment of the present invention is applied.

FIG. 8 is a perspective view showing a notebook-size personal computer to which an embodiment of the present invention is applied. The notebook-size personal computer according to this example of application includes a main body 121, a keyboard 122 which is manipulated when characters or the like are inputted, a display portion 123 for displaying thereon an image, and the like. The notebook-size personal computer is manufactured by using the display device according to an embodiment of the present invention as the display portion 123.

Figure 9:
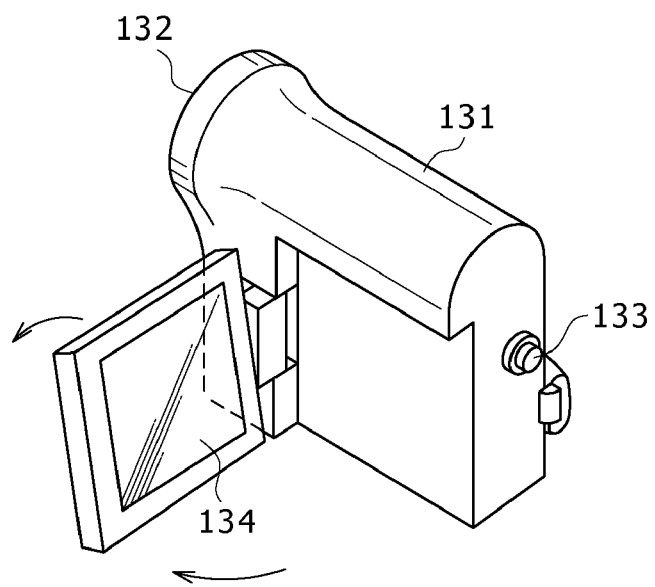
FIG. 9 is a perspective view showing a video camera to which an embodiment of the present invention is applied.

FIG. 9 is a perspective view showing a video camera to which an embodiment of the present invention is applied. The video camera according to this example of application includes a main body portion 131, a lens 132 which captures an image of a subject and which is provided on a side surface directed forward, a start/stop switch 133 which is manipulated when an image of a subject is captured, a display portion 134, and the like. The video camera is manufactured by using the display device according to an embodiment of the present invention as the display portion 134.

FIGS. 10A to 10G are respectively views showing mobile terminal equipment, for example, a mobile phone to which an embodiment of the present invention is applied. FIG. 10A is a front view in an open state of the mobile phone, FIG. 10B is a side view in the open state of the mobile phone, FIG. 10C is a front view in a close state of the mobile phone, FIG. 10D is a left side view of the mobile phone, FIG. 10E is a right side view of the mobile phone, FIG. 10F is a top plan view of the mobile phone, and FIG. 10G is a bottom view of the mobile phone. The mobile phone according to this example of application includes an upper chassis 141, a lower chassis 142, a connection portion (a hinge portion in this case) 143, a display portion 144, a sub-display portion 145, a picture light 146, a camera 147, and the like. The mobile phone is manufactured by using the display device according to an embodiment of the present invention as the display portion 144 or the sub-display portion 145.

EXAMPLES

Structures of concrete examples of the present invention, and comparative examples, and evaluation results thereof will be described below.

Example 1

The display device 1a of the first embodiment previously described with reference to FIG. 1 was manufactured. As shown in TABLE 1, the film thicknesses of the layers constituting the light emission functioning layer 9 are set so that the cavity orders m of the light emitting elements 5r, 5g and 5b become 0, 0 and 1, respectively, by using the materials exemplified in the first embodiment.

TABLE 1

| | Example 1 | | | | | | |
| --- | --- | --- | --- | --- | --- | --- | --- |
| | | Film thickness (nm) | | | | | |
| | Cavity order m | Hole injecting layer 9-1 | Hole transporting layer 9-2 | Film thickness adjusting layer 9-2' | Light emitting layer 9-3 | Electron transporting layer 9-4 | Total film thickness (nm) |
| Red (R) | 0 | 20 | 25 | — | 50 | 25 | 120 |
| Green (G) | 0 | | | — | 30 | | 100 |
| Blue (B) | 1 | | | 100 | 26 | | 196 |

The hole injecting layer 9-1, the hole transporting layer 9-2, the film thickness adjusting layer 9-2', the light emitting layer 9-3, and the electron transporting layer 9-4 shown in TABLE 1 are deposited by utilizing a vacuum evaporation method. The film thickness adjusting layer 9-2' of the blue light emitting element 5b, and the light emitting layers 9-3r, 9-3g and 9-3b are deposited in a pattern by using an evaporation mask. The hole injecting layer 9-1, the hole transporting layer 9-2, and the electron transporting layer 9-4 are collectively deposited as the common layer.

Comparative Example 1

Similarly to the case of Example 1, as shown in TABLE 2, the film thicknesses of the layers constituting the light emission functioning layer 9 are set so that the cavity orders m of the light emitting elements 5r, 5g and 5b became 0, 0 and 1, respectively.

TABLE 2

| | Comparative Example 1 | | | | | |
|---|---|---|---|---|---|---|
| | | Film thickness (nm) | | | | |
| | Cavity order m | Hole injecting layer | Hole transporting layer | Light emitting layer | Electron transporting layer | Total film thickness (nm) |
| Red (R) | 0 | 20 | 25 | 50 | 25 | 120 |
| Green (G) | 0 | 20 | 25 | 30 | 25 | 100 |
| Blue (B) | 1 | 20 | 125 | 26 | 25 | 196 |

All the layers constituting the light emission functioning layer 9 are individually deposited every light emitting element by utilizing the vacuum evaporation method using an evaporation mask. It is noted that the film thickness adjusting layer 9-2' provided only in the blue light emitting element 5b in Example 1 is deposited in a pattern together with the hole transporting layer.

Example 2

The display device 1b of the second embodiment previously described with reference to FIG. 2 is manufactured. As shown in TABLE 3, the film thicknesses of the layers constituting the light emission functioning layer 9 are set so that the cavity orders m of the light emitting elements 5r, 5g and 5b become 0, 1 and 1, respectively, by using the materials exemplified in the second embodiment.

TABLE 3

| | Example 2 | | | | | | |
|---|---|---|---|---|---|---|---|
| | | Film thickness (nm) | | | | | |
| | Cavity order m | Hole injecting layer 9-1 | Hole transporting layer 9-2 | Film thickness adjusting layer 9-2' | Light emitting layer 9-3 | Electron transporting layer 9-4 | Total film thickness (nm) |
| Red (R) | 0 | 20 | 25 | — | 50 | 25 | 120 |
| Green (G) | 1 | | | 100 | 80 | | 250 |
| Blue (B) | 1 | | | | 26 | | 196 |

The layers shown in TABLE 3 are deposited by utilizing the vacuum evaporation method. Also, the film thickness adjusting layers 9-2' of the green light emitting element 5g and the blue light emitting element 5b are deposited in a pattern as the common layer by using the evaporation mask. Moreover, the light emitting layers 9-3r, 9-3g and 9-3b are deposited in a pattern by using the evaporation mask. Also, other layers are collectively deposited as the common layer.

Comparative Example 2

Similarly to the case of Example 2, as shown in TABLE 4, the film thicknesses of the layers constituting the light emission functioning layer 9 are set so that the cavity orders m of the light emitting element 5r, 5g and 5b become 0, 1 and 1, respectively.

TABLE 4

Comparative Example 2

| | | Film thickness (nm) | | | | |
|---|---|---|---|---|---|---|
| | Cavity order m | Hole injecting layer | Hole transporting layer | Light emitting layer | Electron transporting layer | Total film thickness (nm) |
| Red (R) | 0 | 20 | 25 | 50 | 25 | 120 |
| Green (G) | 1 | 20 | 175 | 30 | 25 | 250 |
| Blue (B) | 1 | 20 | 125 | 26 | 25 | 196 |

All the layers constituting the light emission functioning layer 9 are individually deposited every light emitting element by utilizing the vacuum evaporation method using an evaporation mask. It is noted that the film thickness adjusting layer provided only in each of the green light emitting element 5g and the blue light emitting element 5b in Example 2 is deposited in a pattern together as the hole transporting layer in each of the element portions.

Example 3

The display device 1c of the third embodiment previously described with reference to FIG. 3 is manufactured. As shown in TABLE 3, the film thicknesses of the layers constituting the light emission functioning layer 9 are set so that the cavity orders m of the light emitting elements 5r, 5g and 5b become 1, 1 and 1, respectively by using the materials exemplified in the third embodiment.

TABLE 5

Example 3

| | | Film thickness (nm) | | | | | |
|---|---|---|---|---|---|---|---|
| | Cavity order m | Hole injecting layer 9-1 | Hole transporting layer 9-2 | Film thickness adjusting layer 9-2' | Light emitting layer 9-3 | Electron transporting layer 9-4 | Total film thickness (nm) |
| Red (R) | 1 | 20 | 125 | 50 | 80 | 25 | 300 |
| Green (G) | 1 | | | | 30 | | 250 |
| Blue (B) | 1 | | | — | 26 | | 196 |

The layers shown in TABLE 5 are deposited by utilizing the vacuum evaporation method. Also, the film thickness adjusting layers 9-2' of the red light emitting element 5r and the green light emitting element 5g are deposited in a pattern as the common layer by using the evaporation mask. Moreover, the light emitting layers 9-3r, 9-3g and 9-3b are deposited in a pattern by using the evaporation mask. Also, other layers are collectively deposited as the common layer.

Comparative Example 3

Similarly to the case of Example 3, as shown in TABLE 6, the film thicknesses of the layers constituting the light emission functioning layer 9 are set so that the cavity orders m of the light emitting elements 5r, 5g and 5b become 0, 1 and 1, respectively.

TABLE 6

Comparative Example 3

| | Cavity order m | Film thickness (nm) | | | | Total film thickness (nm) |
|---|---|---|---|---|---|---|
| | | Hole injecting layer | Hole transporting layer | Light emitting layer | Electron transporting layer | |
| Red (R) | 1 | 20 | 205 | 50 | 25 | 300 |
| Green (G) | 1 | 20 | 175 | 30 | 25 | 250 |
| Blue (B) | 1 | 20 | 125 | 26 | 25 | 196 |

All the layers constituting the light emission functioning layer 9 are individually deposited every light emitting element by utilizing the vacuum evaporation method using an evaporation mask. It is noted that the film thickness adjusting layer provided only in each of the red light emitting element 5r and the green light emitting element 5g in Example 3 is deposited in a pattern together as the hole transporting layer in each of the element portions.

<Evaluation Results>

In the display devices of Examples 1 to 3, and Comparative Examples 1 to 3 manufactured in the manner described above, there is no occurrence of the vanishing point in any of the light emitting elements constituting these display devices.

In addition, a chromaticity shift, Δu'v', of the view angle of white between the view angle of 0° and the view angle of 45° is measured with respect to each of the display devices. TABLE 7 shows the measurement result. The chromaticity shift Δu'v' is a maximum value when a film thickness dispersion in the totals of the film thicknesses of the light emission functioning layers 9 of the light emitting elements 5r, 5g and 5b is ±4%.

TABLE 7

| Cavity order m | | | Chromaticity shift (view angle 45°) | |
|---|---|---|---|---|
| Red (R) | Green (G) | Blue (B) | Presence of common layer | Absence of common layer |
| 0 | 0 | 1 | 0.017 (Example 1) | 0.034 (Comparative Example 1) |
| 0 | 1 | 1 | 0.018 (Example 2) | 0.035 (Comparative Example 2) |
| 1 | 1 | 1 | 0.030 (Example 3) | 0.063 (Comparative Example 3) |

As shown in TABLE 7, the following respect is understood from the measurement results with respect to Example 1 and Comparative Example 1, Example 2 and Comparative Example 2, and Example 3 and Comparative Example 3 in each set of which the light emission functioning layers formed so as to have the cavity structures are identical in optical design to each other. That is to say, it is understood that as long as the light emission functioning layers are identical in optical design to each other, the chromaticity shifts of the view angle of white in Examples 1 to 3 in each of which as many as possible of the common layers are provided in the light emission functioning layer by applying thereto an embodiment of the present invention are each reduced to about ½ of that of Comparative Examples 1 to 3 in each of which all the layers are individually patterned without providing the common layer in the light emission functioning layer.

From the above, it is confirmed that it is possible to reduce the pixel defects of the light emitting elements, and to enhance the view angle characteristics of white which is readily visualized in terms of the visual features of a human being in the color display device in which the organic electroluminescence elements each having the cavity structure are disposed.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a substrate; and
   a plurality of light emitting elements carried on the substrate, one of the light emitting elements emitting light having a wavelength shorter than those of other lights emitted by other of the light emitting elements,
   wherein,
   each of the light emitting elements has a cavity structure in which a light emission functioning layer is held between a reflecting electrode and a semitransmitting electrode, the light emission functioning layer including at least one of a respective transporting layer, a respective light emitting layer, a respective adjusting layer, a respective hole transporting layer, and a respective hole injecting layer,
   a cavity order of at least the one light emitting element is configured to resonate its light and is 1, and
   the light emission functioning layer, except for the respective light emitting layer or the respective light adjusting layer, is common to all of the light emitting elements.

2. The display device according to claim 1, wherein the plurality of light emitting elements comprising red, blue and green light emitting elements.

3. A display device comprising:
   a substrate; and
   at least first, second and third light emitting elements carried on the substrate, the first, second and third light emitting elements emitting lights having first, second and third wavelengths, respectively, the first wavelength being shorter than the second wavelength, the second wavelength being shorter than the third wavelength, wherein, each of the light emitting elements has a cavity structure in which a light emission functioning layer is held between a reflecting electrode and a semitransmitting electrode, the light emission functioning layer including at least one of a respective transporting layer, a respective light emitting layer, a respective adjusting layer, a respective hole transporting layer, and a respective hole injecting layer, a cavity order of at least the first light emitting element is configured to resonate its light and is 1, and the light emission functioning layer, except for the respective light emitting layer or the respective light adjusting layer, is common to all of the light emitting elements.

4. The display device of claim 3, wherein the cavity order of at least one of the second light emitting element and the third light emitting is 1.

5. The display device of claim 4, wherein the respective light adjusting layer is a common layer between the at least two of the first, second and third light emitting elements.

* * * * *